United States Patent [19]

Barnes

[11] 4,421,952

[45] Dec. 20, 1983

[54] MULTI-FREQUENCY BUSY SIGNAL SYNTHESIZING CIRCUITRY

[75] Inventor: Michael F. Barnes, Hoffman Estates, Ill.

[73] Assignee: Motorola, Inc., Schaumburg, Ill.

[21] Appl. No.: 311,832

[22] Filed: Oct. 16, 1981

[51] Int. Cl.³ .............................................. H03B 19/00
[52] U.S. Cl. .................................. 179/2 EA; 328/25; 340/384 E; 179/90 B
[58] Field of Search ................ 179/2 EA, 90 B, 90 K, 179/84 UF; 340/384 G; 328/25

[56] References Cited

U.S. PATENT DOCUMENTS

| | | |
|---|---|---|
| 3,351,714 | 11/1967 | Kunzelman . |
| 3,706,885 | 12/1972 | Fister et al. . |
| 3,832,639 | 8/1974 | Janssen . |
| 3,838,348 | 9/1974 | Pezzuti . |
| 3,906,166 | 9/1975 | Cooper et al. . |
| 4,028,500 | 6/1977 | McClure et al. . |
| 4,058,805 | 11/1977 | Lake . |
| 4,122,304 | 10/1978 | Mallien . |
| 4,138,595 | 2/1979 | Barkwith . |
| 4,171,466 | 10/1979 | Carbrey . |
| 4,192,007 | 3/1980 | Becker ........................... 179/17 E |
| 4,220,820 | 9/1980 | Mallien . |
| 4,224,596 | 9/1980 | Knickel . |

OTHER PUBLICATIONS

FCC Form #401-"An Application for a Developmental Cellular Mobile and Portable Radio Telephone System in the Washington-Baltimore Northern Virginia Area"-Submitted by: American Radio Telephone Service, Inc.-1600 Crt. Sqr. Building-Baltimore MD, 21202, pp. 4-76 through 4-86, 1977.

"Portable Telephones for Cellular Systems" by Albert J. Leitich and Donald L. Linder MOTOROLA, INC. Chicago Corporate R & D Center 80CH1601-4 Copyright 1980 Vehicular Technology Society IEEE.

Primary Examiner—G. Z. Rubinson
Assistant Examiner—L. C. Schroeder
Attorney, Agent, or Firm—Rolland R. Hackbart; James W. Gillman; Edward M. Roney

[57] ABSTRACT

Circuitry for synthesizing a busy or reorder tone comprised of a first tone having a frequency of 770 Hz and a second tone having a frequency of 1150 Hz is described. The inventive synthesizing circuitry requires only one clock oscillator, whose output is coupled to a programmable divider. The programmable divider is switched between two divisor numbers at a frequency that is substantially one-half of a frequency selected from a predetermined range of frequencies substantially midway between 770 Hz and 1150 Hz. In the preferred embodiment, the programmable divider output is switched between frequencies of 1250 Hz and 883.3 Hz at a 500 Hz rate. The programmable divider output is then interrupted at a 2 Hz rate to provide the synthesized busy signal. The inventive synthesizing circuitry may be advantageously utilized in mobile or portable radios for providing a busy signal that sounds essentially identical to a fast busy or reorder tone comprised of two tones.

8 Claims, 3 Drawing Figures

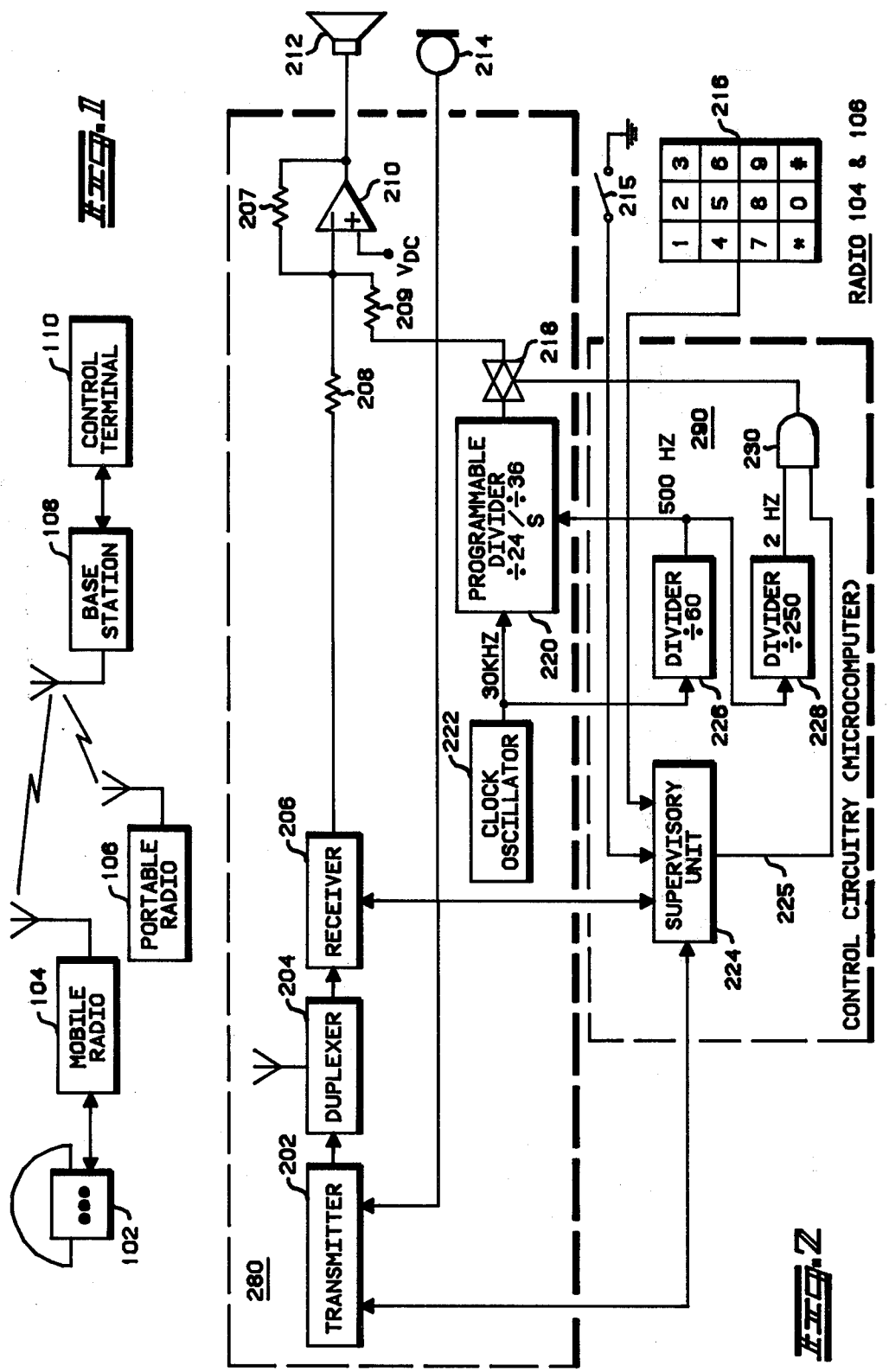

MULTI-FREQUENCY BUSY SIGNAL SYNTHESIZING CIRCUITRY

RELATED PATENT APPLICATION

The instant application is related to the following U.S. patent applications concerned with a portable radiotelephone, filed on Sept. 15, 1980 and assigned to the same assignee as the instant application: Ser. No. 187,304, by Larry C. Puhl et al., entitled "Microprocessor Controlled Radiotelephone Transceiver"; Ser. No. 187,306, by Larry C. Puhl et al., entitled "Interface Adapter Architecture"; Ser. No. 187,302, by Larry C. Puhl, entitled "Communications Microprocessor Architecture"; Ser. No. 187,305, by Larry C. Puhl et al., entitled "Keyboard and Display Interface Adapter Architecture"; and Ser. No. 187,303, by John P. Byrns, entitled "Self-Clocking Data Transmission System and Method Therefor". The instant application is also related to U.S. patent applications, Ser. No. 119,605, by Kenneth A. Felix and James A. Pautler, entitled "Improved Method and Apparatus for Detecting a Data Signal Including Repeated Data Words", and Ser. No. 119,350, by John P. Byrns and Michael J. McClaughry, entitled "Phase-Encoded Data Signal Demodulator", both of which were filed on Feb. 7, 1980, and are also assigned to the instant assignee. By reference thereto, the foregoing related patent applications are incorporated in their entirety into the instant application.

BACKGROUND OF THE INVENTION

The present invention relates generally to tone synthesizing circuitry, and more particularly to multi-frequency tone synthesizing circuitry that is particularly well adapted for synthesizing a multi-frequency busy signal.

Prior art circuitry for generating a multi-frequency busy signal typically includes two tone generators whose outputs are coupled to an analog summing amplifier. The fast busy tone or reorder tone that is utilized in present high-capacity radiotelephone systems is comprised of two tones, 770 Hz, which are interrupted at a 2 Hz rate. In radiotelephone systems, these same two tones are also utilized to generate other supervisory tones, such as an alert tone, a feedback tone and an intercept tone. Since two tone generators are required, these prior art busy signal generators are relatively expensive.

In the prior art radiotelephones described in U.S. Pat. Nos. 4,122,304 and 4,220,820, a busy signal is generated which consists of an 400 Hz tone interrupted at a 1.7 Hz rate. The circuitry of these radiotelephone must likewise include a second tone generator in order to generate a multi-frequency busy signal.

According to another prior art technique, a multi-frequency busy signal can be generated by storing in a memory digitzed samples coded according to conventional linear or non-linear coding formats, and reading out from the memory the digitized samples and decoding them to reconstruct a busy signal when desired. However, such circuitry is relatively expensive since a memory and a ditigal-to-analog converter is required.

Thus, none of the foregoing prior art busy signal generating circuitry provides an adequate multi-frequency busy signal with relatively simple and inexpensive circuitry.

SUMMARY OF THE INVENTION

It is an object of the present invention to provide improved multi-frequency busy signal synthesizing circuitry that is less complex and less expensive than prior art busy signal generating circuitry.

It is another object of the present invention to provide improved multi-frequency busy signal synthesizing circuitry that utilizes only one signal source for synthesizing the multi-frequency busy signal.

According to an embodiment of the present invention, circuitry for synthesizing a multi-frequency busy signal is comprised of a clock signal source, a programmable divider that is switchable between two divisor numbers, an analog switch and timing circuitry for generating a first control signal for selecting the divisor number of the programmable divider and a second control signal for enabling and disabling the analog switch. The divisor number of the programmable divider is swtiched at a frequency that is substantially one-half of a frequency selected from a predetermined range of frequencies substantially midway between the two frequencies of the tones in the desired multi-frequency busy signal. The output signal from the programmable divider is coupled to the analog switch, which is enabled and disabled for interrupting the output signal from the programmable divider at a predetermined rate. The interrupted signal from the analog switch may then be coupled to suitable output circuitry, such as a speaker of a radiotelephone, for providing a synthesized multi-frequency busy signal which sounds substantially identical to the desired multi-frequency busy signal.

BRIEF DESCRIPTION OF THE DRAWINGS

FIG. 1 is a block diagram of a radiotelephone system including mobile radios and portable radios, both of which may advantageously utilize the present invention.

FIG. 2 is a block diagram of a mobile radio or portable radio which includes an embodiment of the present invention.

DETAILED DESCRIPTION OF THE PREFERRED EMBODIMENT

Figure 3:
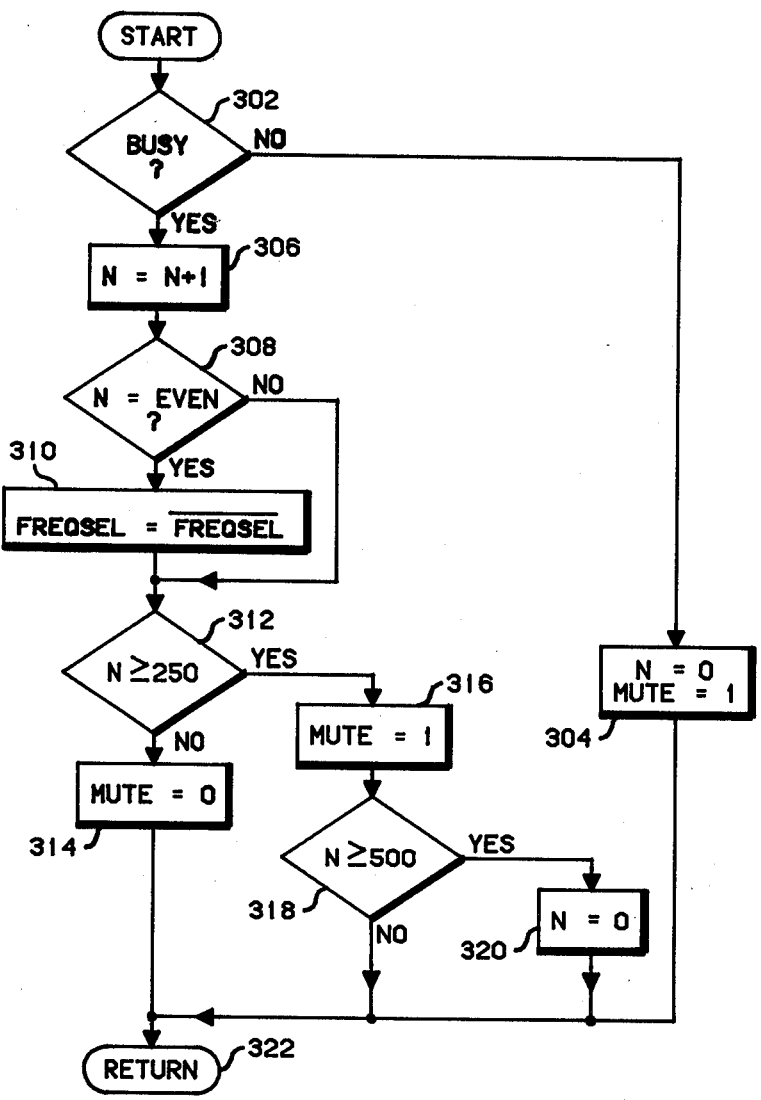
FIG. 3 is a flowchart, which, when executed by a suitably programmed microcomputer, provides the signals for controlling programmable divider 220 and analog switch 218 in FIG. 2.

In FIG. 1, there is illustrated a block diagram of a radiotelephone system of the type described in U.S. Pat. No. 3,906,166 and in a developmental cellular radiotelephone system application, filed by Motorola and American Radiotelephone Service, Inc., under docket number 18262 with the Federal Communications Commission in Feb., 1977. The radiotelephone system includes one or more base stations 108, a control terminal 110 coupled to base station 108, and a plurality of mobile radios 104 and portable radios 106. Mobile radio 104 is coupled to a control unit 102 which includes a telephone handset, while portable radio 106 has a built in telephone handset (eg. see the portable radio in U.S. Pat. No. D234,605 and U.S. patent application Ser. No. 231,552, invented by Albert Leo Nagele and Kenneth W. Larson, filed on Feb. 4, 1981 and also assigned to the instant assignee). The detailed circuitry in portable radio 106 is described in the related patent applications listed hereinabove and in a paper entitled "Portable Telephones for Cellular Systems", by Albert J. Leitich and Donald L. Linder, presented at the 30th Annual Conference of the IEEE Vehicular Technology Society on Sept. 15 to 17, 1980, in Dearborn, Michigan. As to the other blocks in the system in FIG. 2, the detailed circuitry in mobile radio 104 is described in Motorola instruction manual 68P81037E85, control unit 102 in Motorola instruction manual 68P81031E65, base station 108 in Motorola instruction manual 68P81033E10 and control terminal 110 in Motorola instruction manual 68P81028E65. The aforementioned Motorola instruction manuals may be obtained from Motorola Service Publications Department located at 1301 East Algonquin Road in Schaumburg, Illinois.

Both mobile radio 104 and portable radio 106 in the radiotelephone system in FIG. 2 can automatically place telephone calls to landline parties or other mobile and portable radios. The telephone service provided to mobile radio 104 and portable radio 106 in such radiotelephone systems is substantially identical to the telephone service provided to landline telephone users. Thus, in the event that mobile radio 104 or portable radio 106 is not able to obtain a radio channel for placing a call through base station 108 and control terminal 110, a multi-frequency busy signal (fast busy or reorder tone) is provided to the radiotelephone user by mobile radio 104 or portable radio 106. By utilizing the multi-frequency busy synthesizing circuitry of the present invention, a synthesized busy signal can be provided to radiotelephone users which sounds substantially identical to the multi-frequency fast busy or reorder tone.

Referring to FIG. 2, there is illustrated a more detailed block diagram of a mobile or portable radio that includes an embodiment of the prevent invention. The radio includes transmitting, receiving and audio circuitry 280, control circuitry 290 and a speaker 212, microphone 214, hookswitch 215 and pushbutton (or rotary) dial 216, which are typically part of a handset in a mobile radio and part of the radio housing itself in a portable radio. In order to place a call, the handset is picked up or an off-hook pushbutton is depressed, and the desired telephone number is dialed by means of dial 216. Once the called party answers, conversation can take place between the two parties.

The radio frequency portion of the circuitry in block 280 consists of transmitter 202, receiver 206 and duplexer 204 which couples transmitter 202 and receiver 206 to an antenna. Duplexer 204 also provides for isolation between the signal from transmitter 202 and the signal to receiver 206. Voice signals from microphone 214 are coupled to transmitter 280 for frequency modulating a radio frequency signal. Transmitter 202 is enabled and disabled by supervisory unit 224. Receiver 206 demodulates the received RF signal to provide received voice signals, which are coupled via resister 208 to operational amplifier 210 and thereafter to speaker 212. Receiver 206 is likewise enabled and disabled by supervisory unit 224.

Supervisory unit 224 is also coupled to hookswitch or off-hock pushbutton 215 and dial 216. When the radiotelephone user picks up the handset or activates an off-hook pushbutton, the signal from hookswitch 215 is grounded. Supervisory unit 224 is responsive to the grounded signal from hookswitch 215 for establishing a radio frequency communication link between the radiotelephone and the base station. Supervisory unit 224 controls both the transmitter 202 and receiver 206 for generating and receiving the supervisory tone signalling necessary for receiving and placing telephone calls.

Supervisory unit 224 may be the type of unit described in U.S. Pat. Nos. 3,458,664 and 3,571,519 or the type of unit described in the aforementioned related patent applications and Motorola instruction manuals.

If, in attempting to place a call, the supervisory unit 224 acertains that all of the available radio channels are in use, a busy enable signal 225 is generated for providing a synthesized busy signal to the radiotelephone user. When all radio channels are busy, the radiotelephone user is alerted to this fact by the fast busy or reorder tone, which may be synthesized by utilizing the present invention.

The embodiment of the busy signal synthesizing circuitry of the present invention illustrated in the radio in FIG. 2, includes clock oscillator 222, programmble divider 220, divider 226, divider 228, AND gate 230 and analog switch 218. Programmable divider 220 is switched between two divisor numbers in response to the output of divider 226. In the preferred embodiment, clock oscillator has a frequency of 30 kHz, and divider 226 has a divisor number of 60. Since the desired busy signal is comprised of tone signals having a fequency of 770 Hz and 1150 Hz, the divisor number of divider 226 may be selected to provide an output having a frequency that is substantially one half of a frequency selected from a predetermined range of frequencies midway between 770 Hz and 1150 Hz. A suitable range of frequencies has been experimentally determined to extend from approximately 800 Hz to 1000 Hz, where the average frequency between 770 Hz and 1150 Hz is 960 Hz. In the preferred embodiment, 1000 Hz was selected from this range of frequencies, such that the output of divider 226 has a frequency of 500 Hz. Therefore, to provide a 500 Hz output from divider 226, the divisor number was selected to be 60.

The 500 Hz output from divider 226 is coupled to programmable divider 220 and causes the divisor number of programmable divider 220 to be switched between 24 and 36. Since the clock signal from clock oscillator 222 has a frequency of 30 kHz, the output from programmable divider 220 has a frequency of 1250 Hz for divisor number 24 and a frequency of 833.3 Hz for divisor number 36. Both of these frequencies are slightly higher than the desired frequencies of 1150 Hz and 770 Hz. Thus, the output from programmable divider 220 is a signal alternately having frequencies of 1250 Hz and 833.3 Hz at a 500 Hz rate.

In order to interrupt the output of programmable divider 220, analog switch 218 is alternately enabled and disabled at a 2 Hz rate by the output of divider 228. The 2 Hz output from divider 228 is generated by dividing the 500 Hz output from divider 226 by 250. The output of divider 228 is applied to analog switch 218 by AND gate 230. AND gate 230 is enabled or disabled by the busy enable signal 225 from supervisory unit 224. The interrupted output of programmable divider 220 is coupled via resister 209 to operational amplifier 210 and thereafter to speaker 212.

According to an important feature of the present invention, the busy signal synthesizing circuitry requires only one clock oscillator 222. By switching programmable divider 220 between divisor numbers 24 and 36 at a 500 Hz rate and interrupting the programmable divider output by means of switch 218 at a 2 Hz rate, a synthesized busy signal is provided that sounds essentially identical to a fast busy or reorder tone comprised of two tones.

According to another embodiment of the present invention, the control circuitry in block 290 can be provided by a suitably programmed microcomputer, such as the Motorola type MC6801 microcomputer, the microcomputer described in U.S. Pat. Nos. 4,122,304 and 4,220,820 or the microcomputer described in the aforementioned U.S. patent application Ser. Nos. 187,304 and 187,302. The microcomputer can be suitably programmed to execute the flowchart in FIG. 3 for generating the 500 Hz signal for controlling programmable divider 220 and the 2 Hz signal for controlling analog switch 218. The variable FREQSEL is the 500 Hz signal, and the variable MUTE is the 2 Hz signal. The flowchart in FIG. 3 can be incorporated into the interrupt routine of the microcomputer for execution at periodic time intervals, such as 1 millisecond intervals.

Referring to the flowchart of FIG. 3, for each interrupt, a test is made at block 302 to see if the radiotelephone is busy. If the radiotelephone is not busy, NO branch is taken to block 304 where N is set equal to 0 and MUTE is set equal to 1, after which program control returns by block 350. This, since MUTE=1, analog switch 218 in FIG. 2 is disabled.

If the radiotelephone is busy, then YES branch is taken from block 302 to block 304 where N is incremented by 1. Next, at block 308, if N is an even number, YES branch is taken to block 310 where FREQSEL is complemented (that is, if a 0, it is made a 1, and vice versa). If N is odd, NO branch is taken from block 308 to block 312. Thus, the binary state of FREQSEL is changed every other interrupt or at a rate of 500 Hz for switching programmable divider 226 in FIG. 2 between divisor numbers 24 and 36.

At block 312, if N is less than 250, NO branch is taken to block 314 where MUTE is set equal to 0 for enabling analog switch 218 in FIG. 2. If N is greater than or equal to 250, YES branch is taken from block 312 to block 316 where MUTE is set equal to 1 for disabling analog switch 218. Next, at block 318, if N is equal to or greater than 500, YES branch is taken to block 320 where N is set to zero. Otherwise, NO branch is taken from block 318 to block 322 where program control returns to other tasks not illustrated. Thus, N ranges from 0 to 500 for switching the MUTE variable between 0 and 1 every 250 milliseconds in order to interrupt the synthesized busy signal from programmable divider 226 at a 2 Hz rate by enabling and disabling analog switch 218.

Many variations of the flowchart in FIG. 3 can be devised depending on the organization and priority of the tasks to be performed by the microcomputer. For example, N may be incremented in the interrupt routine and the rest of the flowchart in FIG. 3 may be executed as a high-priority subroutine.

In summary, multi-frequency busy signal synthesizing circuitry has been described that utilizes a single clock signal source for synthesizing a busy signal that sounds essentially identical to the fact busy or reorder tone comprised of two tones. The busy signal is generated by switching a programmable divider between two divisor numbers at a 500 Hz rate and interrupting the programmable divider output at a 2 Hz rate. Moreover, additional multi-frequency signals or single-frequency signals can readily be generated by the synthesizing circuitry of the present invention by selecting suitable divisor numbers of the programmable divider. Since only one clock signal source is needed, the inventive multifrequency busy signal synthesizing circuitry is less complex and less expensive than prior art busy signal generating circuitry.

I claim:

1. Circuitry for synthesizing a tone output signal that approximates a multi-frequency signal comprised of a first tone having a first predetermined frequency and a second tone having a second predetermined frequency, said synthesizing circuitry comprising:

a signal source for generating a clock signal having a predetermined frequency that is greater than said first predetermined frequency and said second predetermined frequency;

means for generating a control signal alternately having first and second states at a frequency that is substantially one-half of a frequency selected from a predetermined range of frequencies substantially midway between said first predetermined frequency and said second predetermined frequency; and means coupled to the clock signal source and generating means for dividing the clock signal by a first number in response to the first state of the control signal to produce the tone output signal having a first frequency greater than said first predetermined frequency and by a second number in response to the second state of the control signal to produce the tone output signal having a second frequency that is greater than said second predetermined frequency.

2. The synthesizing circuitry according to claim 1, further including:

output signal utilization means;

second means for generating a second control signal alternately having first and second states at a predetermined frequency.

switching means for coupling the tone output signal to the output signal utilization means in responses to a first state of a second control signal and decoupling the tone output signal from the output signal utilization means in response to a second state of the second control signal.

3. The synthesizing circuitry according to claim 2, further adapted for use in a radio for synthesizing a busy signal, said output signal utilization means comprising a handset having a speaker and microphone coupled to the radio, said radiotelephone operable on at least one radio channel and generating a busy enable signal when the radio channel is in use by another radio, and said second generating means responsive to the busy enable signal for generating the second control signal.

4. The synthesizing circuitry according to claim 2 or 3, wherein said first tone has a frequency of 770 Hertz and said second tone has a frequency of 1150 Hertz, and wherein said range of frequencies extends from 800 Hertz to 1000 Hertz.

5. The synthesizing circuitry according to claim 4, wherein said first generating means includes second dividing means coupled to the clock signal source for dividing the clock signal by a predetermined number to provide the first control signal, and wherein said second generating means includes third dividing means coupled to the clock signal source for dividing the clock signal by a predetermined number to provide the second control signal.

6. The synthesizing circuitry according to claim 5, wherein said clock signal has a frequency of 30,000 Hertz, said first number of said first dividing means is 24, said second number of said first dividing means is 36, said predetermined number of said second dividing means is 60, and said predetermined number of said second dividing means is 250.

7. A method for synthesizing a tone output signal that approximates a multi-frequency signal comprised of a first tone having a first predetermined frequency and a second tone having a second predetermined frequency, said method comprising the steps of:
(a) generating a clock signal having a frequency that is greater than said first predetermined frequency and said second predetermined frequency;
(b) generating a control signal alternately having first and second states at a frequency that is substantially one-half of a frequency selected from a predetermined range of frequencies substantially midway between said first predetermined frequency and said second predetermined frequency; and
(c) dividing the clock signal by a first number in response to the first state of the control signal to produce the tone output signal having a first frequency greater than said first predetermined frequency and by a second number in response to the second state of the control signal to produce the tone output signal having a second frequency that is greater than said second predetermined frequency.

8. The method according to claim 7, further including the steps of:
(d) generating a second control signal alternately having first and second states at a predetermined frequency; and
(e) coupling the tone output signal to output signal utilization means in response to the first state of the second control signal and decoupling the tone output signal from the output signal utilization means in response to the second state of the second control signal.

* * * * *